(12) United States Patent
Yazid et al.

(10) Patent No.: US 7,411,280 B2
(45) Date of Patent: Aug. 12, 2008

(54) CHIP SUPPORT OF A LEADFRAME FOR AN INTEGRATED CIRCUIT PACKAGE

(75) Inventors: Mohamad B Wagiman Yazid, Singapore (SG); Pauline Low Min Wee, Singapore (SG)

(73) Assignee: Infineon Technologies AG, Munich (DE)

( * ) Notice: Subject to any disclaimer, the term of this patent is extended or adjusted under 35 U.S.C. 154(b) by 104 days.

(21) Appl. No.: 11/364,457

(22) Filed: Feb. 28, 2006

(65) Prior Publication Data

US 2006/0138678 A1      Jun. 29, 2006

Related U.S. Application Data

(63) Continuation of application No. PCT/SG03/00201, filed on Aug. 29, 2003.

(51) Int. Cl.
   *H01L 23/495*   (2006.01)
   *H01L 21/44*   (2006.01)
(52) U.S. Cl. .................. 257/676; 257/673; 438/111; 438/123
(58) Field of Classification Search .............. 438/111, 438/112, 123–127; 257/666, 673, 676
See application file for complete search history.

(56) References Cited

U.S. PATENT DOCUMENTS

| | | | | |
|---|---|---|---|---|
| 6,001,671 A | * | 12/1999 | Fjelstad | ............. 438/112 |
| 6,208,023 B1 | | 3/2001 | Nakayama et al. | |
| 6,498,099 B1 | * | 12/2002 | McLellan et al. | ......... 438/689 |
| 6,551,859 B1 | * | 4/2003 | Lee et al. | ............. 438/112 |
| 6,586,677 B2 | * | 7/2003 | Glenn | ............. 257/781 |
| 6,861,295 B2 | * | 3/2005 | Jung et al. | ............. 438/124 |
| 6,967,396 B1 | * | 11/2005 | Shibata | ............. 257/684 |

FOREIGN PATENT DOCUMENTS

| | | |
|---|---|---|
| EP | 0 546 435 A2 | 6/1993 |
| EP | 0 895 287 A2 | 2/1999 |
| JP | 58027353 | 2/1983 |
| JP | 63202948 | 8/1988 |
| JP | 07030048 A | 1/1995 |
| JP | 2001358279 | 12/2001 |
| KR | 2002066580 A | 8/2002 |
| TW | 472375 A | 1/2002 |

* cited by examiner

*Primary Examiner*—Kevin M Picardat
(74) *Attorney, Agent, or Firm*—Slater & Matsil, L.L.P.

(57) ABSTRACT

The central region of a leadframe (101, 201, 301, 401, 501, 601, 701, 801, 901, 1001, 1101, 1201), is selectively etched to leave upright portions (104, 204, 304, 404, 504, 604, 704, 804, 904, 1004, 1104, 1204). Subsequently, during the packaging process, an integrated circuit (3) is located on the central region of the leadframe, and wires (107) are formed between the upright portions of the leadframe and contacts (5) of the integrated circuit (3), which are to be grounded. Subsequently, the wires and upright portions of the leadframe are encased in resin (116). Since the upright portions of the leadframe are encased in resin, the resin (116) is mechanically locked to the leadframe. Furthermore, any delamination that occurs between the resin (116) and the leadframe cannot propagate easily up the sides of the upright portions as far as the wires (107), so the wires (107) are unlikely to be torn from the upright portions (104, 204, 304, 404, 504, 604, 704, 804, 904, 1004, 1104, 1204). Any adhesive that leaks from under the integrated circuit (3) when the integrated circuit (3) is mounted on the leadframe, is most unlikely to cover any part of the upper surface of the upright portions.

19 Claims, 10 Drawing Sheets

CHIP SUPPORT OF A LEADFRAME FOR AN INTEGRATED CIRCUIT PACKAGE

This application is a continuation of co-pending International Application No. PCT/SG2003/000201, filed Aug. 29, 2003, which designated the United States and was published in English, which application is incorporated herein by reference.

TECHNICAL FIELD

The present invention relates to packaging integrated circuits, and in particular to how an integrated circuit can be packaged such that wire bonds can be formed reliably from certain contacts of the integrated circuit to a body, which is at a ground potential. The invention provides packaging methods, leadframes for use in the method, and integrated circuit packages produced by the method.

BACKGROUND

The term "integrated circuits" in this document refers to dies, usually consisting substantially of a semiconductor material, and having electrical contacts formed on their upper surfaces. During a packaging process, the dies are embedded in a resin body from which electrically conductive leads extend.

A known packaging method is illustrated in FIG. 1, which consists of FIGS. 1a and 1b. FIG. 1a is a top view of a central portion 1 of a leadframe, while FIG. 1b is a cross-sectional view along the line A-A. The central portion 1 of the leadframe is made of a conductive material. For example, it may be a copper plate. The leadframe includes further portions (not shown) outside the region 1, including leads. An integrated circuit 3 is adhered on a "die pad" area within the portion 1. The integrated circuit 3 includes electrical contacts on its upper surface. Certain of these electrical contacts of the chip are bonded by wire bonds (not shown) to respective contacts on the leads of the leadframe. However, certain of the contacts 5 of the integrated circuit 3 are to be connected to ground. To do this, the central portion 1 of the leadframe is connected to ground (not shown), and wire bonds 7 are formed between contacts 5 and respective contacts on the copper 1. In general, it is found that the adhesion of the wire bonds 7 with the copper 1 is not adequate, and therefore silver regions 9 are plated in the locations of the copper 1 where the wire bonds 7 terminate. Subsequently, the integrated circuit 3, wire bonds 7 and silver plated regions 9 are encased in resin. During the same resin molding process, the wire bonds (not shown) between the integrated circuit 3 and the leads (not shown) are encased in a resin body.

This process suffers from a number of problems. A first is that, in subsequent use of the device, the resin body may delaminate from the portion 1 of the leadframe. This delamination propagates rapidly across the surface of the portion 1, and can cause the wires 7 to be torn from the silver plating 9.

A second problem is that, when the integrated circuit 3 is adhered to the portion 1 of the leadframe, the adhesive may leak from beneath the integrated circuit 3 and cover some of the regions of the silver plating 9. In this case, it may be impossible to form reliable wire bonds 7 to the regions of the silver plating 9.

A third problem is that, since the regions of silver plating 9 are arranged to coincide with locations of the contacts 5 on the integrated circuit 3, the silver plated leadframe must be designed using knowledge of the integrated circuit 3. In other words, different designs of leadframes are required for packaging different integrated circuits. This reduces the flexibility of the packaging process. This problem is addressed by a second known packaging process shown in FIGS. 2a and 2b. Elements in these figures that correspond to those of FIG. 1 are shown by the same reference numerals. The process differs from that of FIG. 1 only in that regions 9 are replaced by a ring 11 of silver plating along the external periphery of the portion 1 of the leadframe. The wire bonds 7 of FIG. 1 are replaced by wire bonds 13 between the contacts 5 and the ring 11. Thus, a wide variety of different types of integrated circuit 3 can be packaged with the same type of leadframe. Unfortunately, this arrangement suffers from the problem that the ring 11 must be along the external periphery of the portion 1 of the leadframe in order for the die pad area to be able to accommodate integrated circuits of varying size. So, when the integrated circuit 3 is relatively small, the wires 13 must be much longer than the wires 7 in the arrangement of FIG. 1. Furthermore, the resin's adhesion to silver tends to be less than adhesion to copper, so the arrangement of FIG. 2, in which a larger surface of the portion 1 of the leadframe is covered by silver plating 11, suffers from a higher risk of delamination between the resin and the leadframe.

SUMMARY OF THE INVENTION

The present invention aims to provide new and useful techniques for packaging integrated circuits, and new and useful packaged integrated circuits. In particular, the invention aims to provide integrated circuit packages in which the wires are less liable to lose electrical contact with the central grounded portion of the leadframe.

In general terms, the invention proposes that the central region of the leadframe is selectively etched to leave upright portions. Subsequently, during the packaging process, wires are formed between the upright portions of the leadframe and the contacts of the integrated circuit that are to be grounded. Subsequently, the wires and upright portions of the leadframe are encased in resin.

Since the upright portions of the leadframe are encased in resin, the attachment of the resin to the leadframe is much improved. In the first place, this is because the area of the leadframe that is in contact with the resin is increased (since it includes the sides of the upright portions).

Furthermore, there is mechanical locking, so that the attachment of the resin to the leadframe does not have to rely only on adhesion between the resin and the copper. This mechanical locking is particularly great if the surfaces of the upright portions are concave: a shape, which normally arises automatically in the etching process.

Furthermore, any delamination which occurs between the resin and the leadframe cannot propagate easily up the sides of the upright portions as far as the wires. Thus, the wires are much less likely to be torn from the leadframe.

Furthermore, even if adhesive leaks from under the integrated circuit when the integrated circuit is mounted on the leadframe, it is most unlikely that it could cover any part of the upper surface of the upright portions of the leadframe.

As in known designs, silver is plated onto the upper surface of the upright portions of the leadframe.

Specifically, a first aspect of the invention is a leadframe for packaging an integrated circuit, the leadframe including a central portion formed of conductive material that includes a die pad area for attachment of an integrated circuit, the central portion including one or more upright portions electrically connected to the die pad area and contacts of the leadframe that are grounded.

A second aspect of the invention is a method of packaging an integrated circuit including locating an integrated circuit on the die pad area of a leadframe described above, forming wires between one or more electrical contacts of the integrated circuit and the upright portions of the leadframe, and encapsulating the integrated circuit, wires and the upright portions of the leadframe in a resin body.

A third aspect of the invention is an integrated circuit package including an integrated circuit located at a die pad portion of a conductive body having upright portions, wire bonds between at least one electrical contact of the integrated circuit and a respective contact on the upright portions, and a resin body encapsulating the wire bonds.

BRIEF DESCRIPTION OF THE DRAWINGS

Preferred features of the invention will now be described, for the sake of illustration only, with reference to the following figures in which.

DETAILED DESCRIPTION OF ILLUSTRATIVE EMBODIMENTS

Figure 3A:
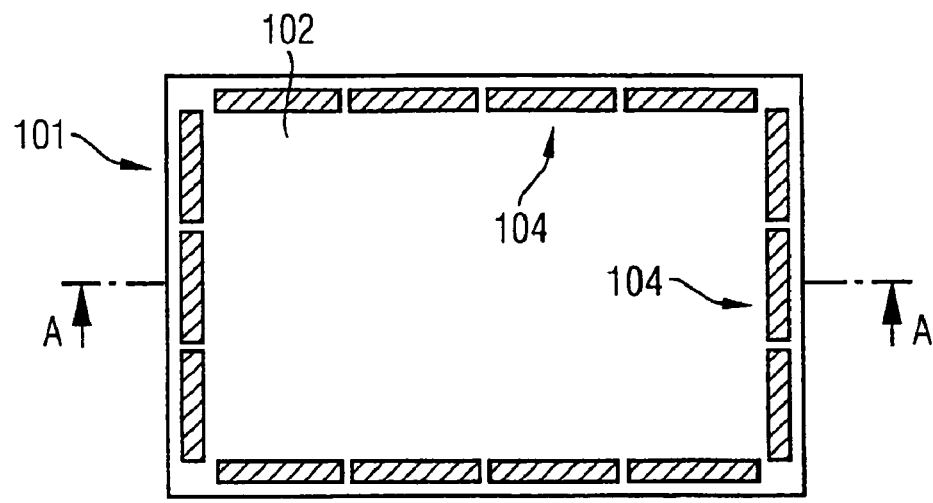
FIG. 3, which is composed of FIGS. 3a to 3c, is three views of a leadframe which is a first embodiment of the invention.
Figure 3B:
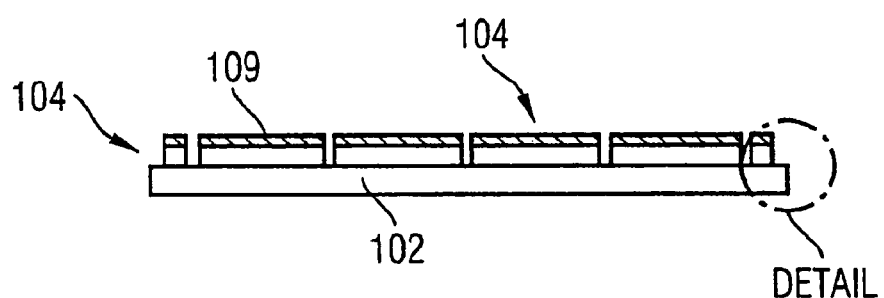
Figure 3C:
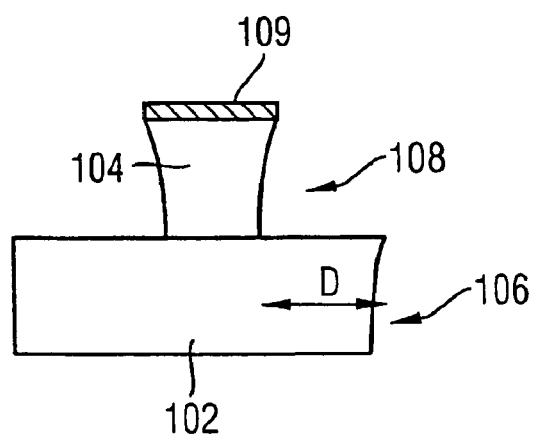

Referring to FIG. 3, a central portion of a leadframe, which is a first embodiment of the invention, is illustrated. FIG. 3a is a top view, FIG. 3b is a sectional view in the line A-A, and FIG. 3c is an enlarged view of the portion of marked "detail" in FIG. 3b. The leadframe has a central portion 101, and further portions (not shown), which are located to the sides of the central portion 101. These further portions of the leadframe are according to conventional designs, and typically include leads, which extend in a plane parallel to the major surface of the portion 101. The tips of the leads are for wire bonding to respective contacts of an integrated circuit, which is mounted on a die pad region at the center of the central portion 101 of the leadframe.

Subsequently, in the molding operation described below, these wire bonds are encased in resin, and the leads are cut to leave portions of the leads extending to the sides of the resin portion, or indeed out of it, so that the leads can be connected for further circuitry. All these features may be according to any conventional design.

The central portion 101 of the leadframe is composed of a copper plate 102 and portions 104, which stand upright on the plate. The upright portions 104 are referred to here as "pedestals." Each of the pedestals 104 has a layer of silver plating 109 on its upper surface. Thus, the silver plating 109, the corresponding pedestal 104 and the copper plate 102 are in electrical contact with each other.

As shown in FIG. 3c, the pedestal 104 is slightly inward from the edge 106 of the copper plate 102 by a distance "D". The pedestal 104 has concave walls 108.

Figure 4A:
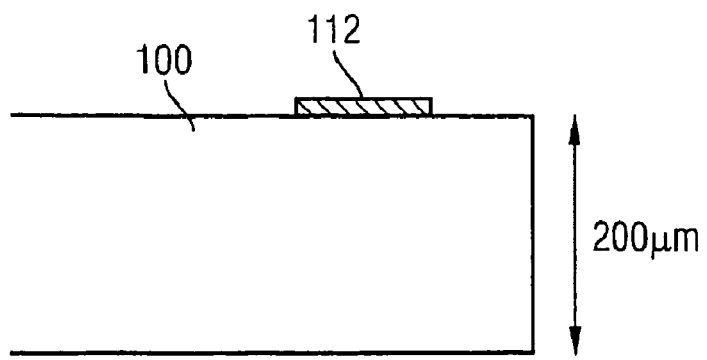
FIG. 4, which is composed of FIGS. 4a and 4b, shows steps in the formation of the leadframe of FIG. 3.
Figure 4B:
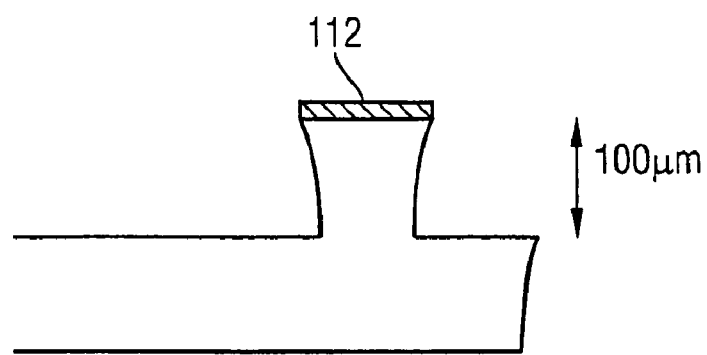

The formation process of the portion 101 of the leadframe is shown in FIG. 4, which, for simplicity, shows only the parts of the structure that will become the structure of FIG. 3c. To begin with, as shown in FIG. 4a, a copper plate of thickness of about 200 μm is coated with mask elements 112 (e.g., of a material commonly used in this field for masking portions of the leadframe that are to become leads) in locations corresponding to those of the pedestals 104 in the structure of FIG. 3c. Then the leadframe is etched, removing a top layer of the plate 110 of a thickness about 100 μm. That is, the thickness of the plate 110 is approximately halved. The regions of the plate 110 protected by the mask elements 112 are not etched, and thus the copper underneath them forms pedestals 104 of a height about 100 μm (in other possible forms of the invention the pedestals may have differing heights, but they are typically in the range 50 μm to 150 μm). Thus, the structure of FIG. 4b is formed. The mask elements 112 are then removed, and the tops of the pedestals 104 are plated with silver to form the structure of FIG. 3c.

Note that the etching of the plate 110 is typically performed at the same time as a known etching step on the portions of the leadframe in which the leads are formed. These leads are located outside the central portion 101 of the leadframe.

Figure 1A:
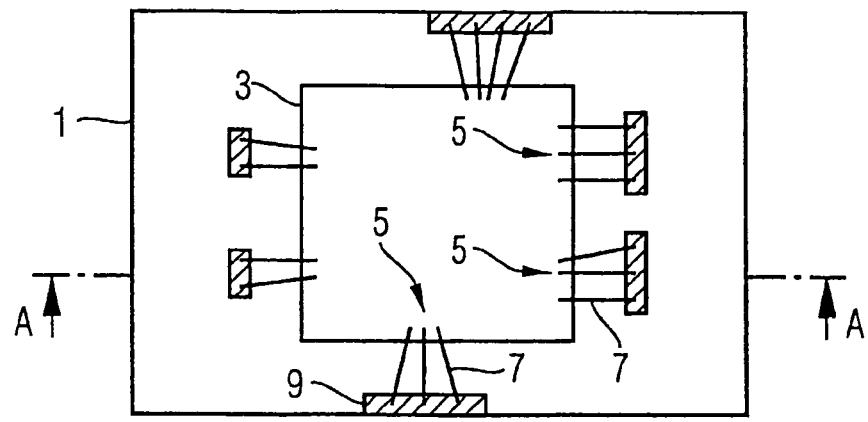
FIG. 1, which is composed of FIGS. 1a and 1b, illustrates a stage of a first known packaging technique.
Figure 1B:
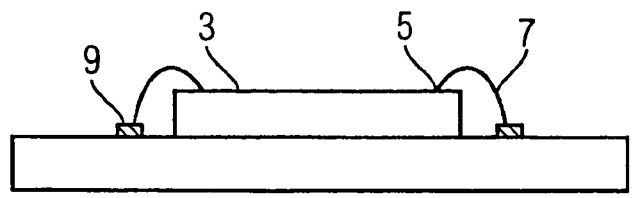
Figure 5A:
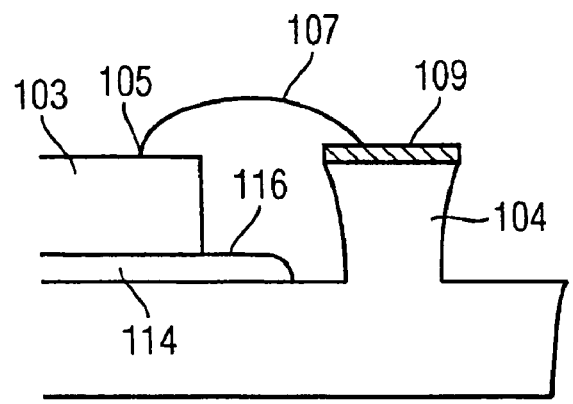
FIG. 5, which is composed of FIGS. 5a and 5b, shows steps in a packaging process using the leadframe of FIG. 3.

The use of the leadframe of FIG. 1 is illustrated in FIG. 5. In FIG. 5a, an integrated circuit 103 is placed on the leadframe, and preferably adhered there. The top of the adhesive layer 114 is lower than tops of the pedestals 104, so that even if adhesive 114 leaks out, it cannot reach the tops of the pedestals 104.

The leadframe has certain contacts 105, which are to be connected to ground potential, and wire bonds 107 are formed from these to the silver portions 109. This is typically done at the same time as wires are formed between contacts of the integrated circuit and the leads of the leadframe located outside the central portion 101 of the leadframe.

Figure 5B:
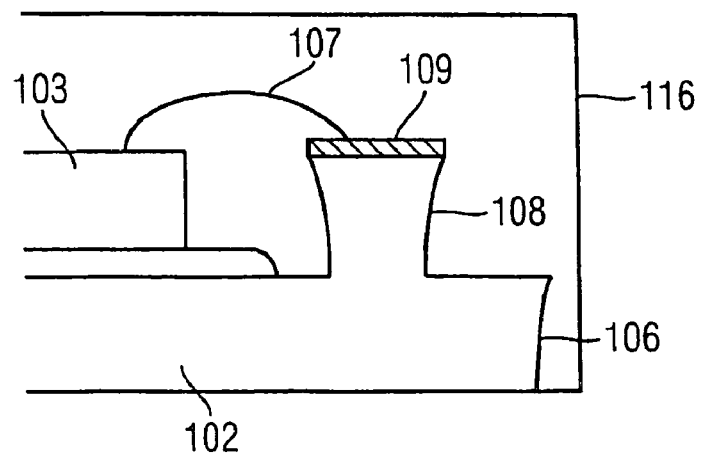

Then, as shown in FIG. 5b, a resin body 116 is molded, so that the integrated circuit 103, the wire bonds 107 and pedestals 104, are encased in the resin 116. Typically, the wires (not shown) between the other contacts of the integrated circuit 103 and the leads are encased in the same resin body 116 at the same time. The pedestals 104 provide mechanical locking between the resin 116 and the plate 110, especially because of the concave surfaces 108. Further locking is provided by the concave surfaces 106 of the plate 102 produced during etching. Even if delamination between the resin 116 and plate 102 does occur, it can only propagate easily only along the top surface of the plate 102 (i.e., "laterally", that is horizontally as viewed in FIG. 3c), not up the sides of the pedestals 104. Therefore, there is little chance of the wires 107 being torn from the silver plating 109. Thus, a reliable electrical contact is formed between the contacts 105 and the plate 102, which is connected to ground (e.g., attached to a grounded area of a printed circuit board).

Figure 6A:
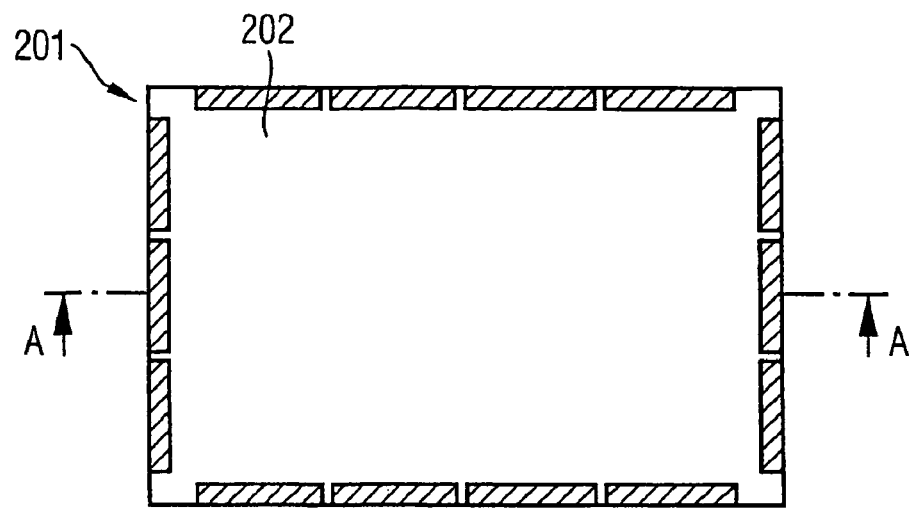
FIG. 6, which is composed of FIGS. 6a to 6c is three views of a leadframe which is another embodiment of the invention.
Figure 6B:
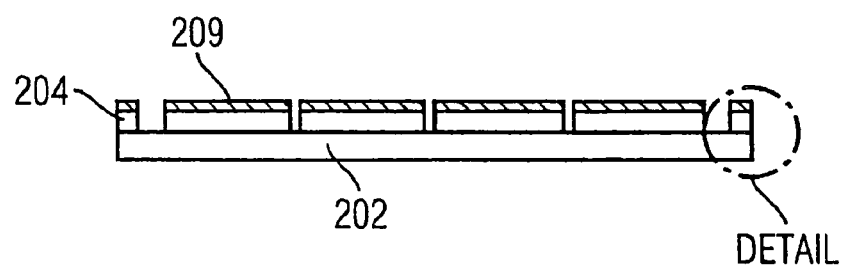
Figure 6C:
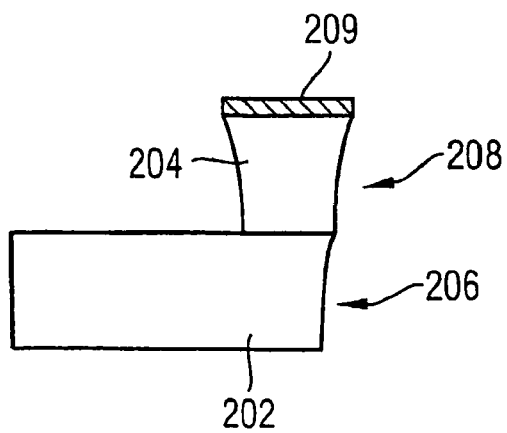

FIGS. 6a to 6c are views of a second leadframe 201 according to embodiments of the invention. Elements of the leadframe 201 are given reference numbers, which are greater by 100 than the corresponding elements of the leadframe 101 of FIG. 3. The difference between the leadframes 101 and 201 is that the pedestals 204 extend to the outer edge 206 of the copper plate 202. The fabrication process, and use, of the central portion of the leadframe 201 is as explained above with reference to FIGS. 4 and 5, but with different positions of the mask elements.

Figure 7A:
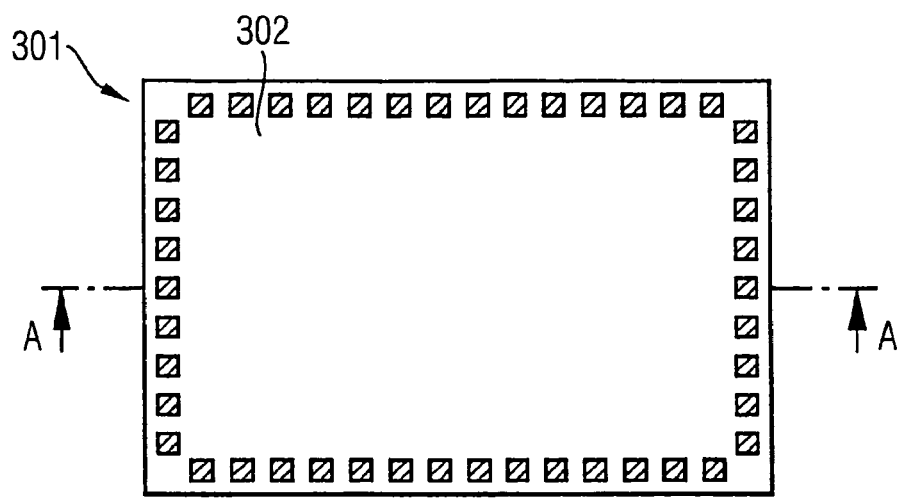
FIG. 7, which is composed of FIGS. 7a to 7h, shows four leadframes which are other embodiments of the invention.
Figure 7B:
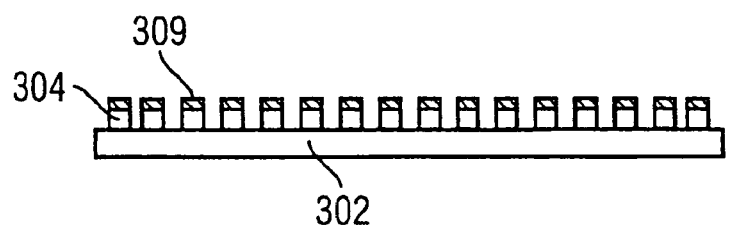

FIGS. 7a and 7b are views of a third leadframe 301 according to embodiments of the invention. Elements of the leadframe 301 are given reference numbers that are greater by 200 than the corresponding elements of the leadframe 101 of FIG. 3. The pedestals 304 are much shorter than the pedestals 104/204 in the plane of the copper plate 301. This can improve the mechanical interlocking of the resin body and the leadframe 301.

Figure 7C:
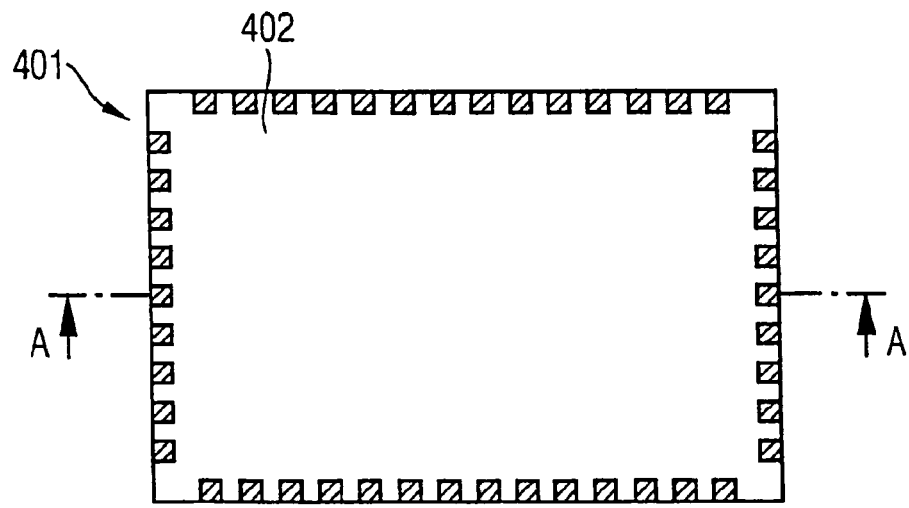
Figure 7D:
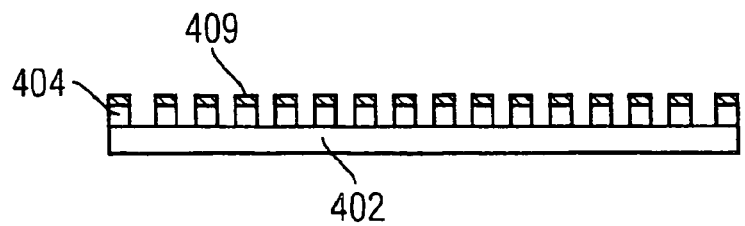

FIGS. 7c and 7d are views of a fourth leadframe 401 according to embodiments of the invention. Elements of the leadframe 401 are given reference numbers that are greater by 300 than the corresponding elements of the leadframe 101 of FIG. 3.

Figure 2A:
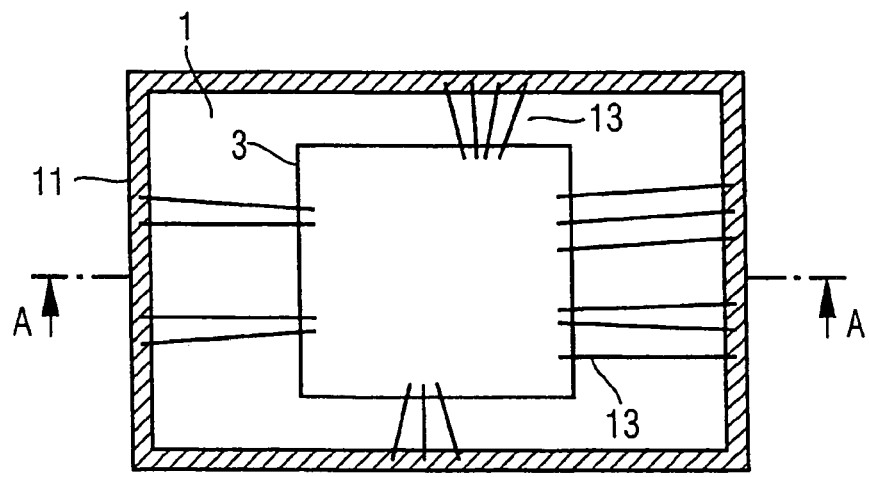
FIG. 2, which is composed of FIGS. 2a and 2b, illustrates a stage of a second known packaging technique.
Figure 2B:
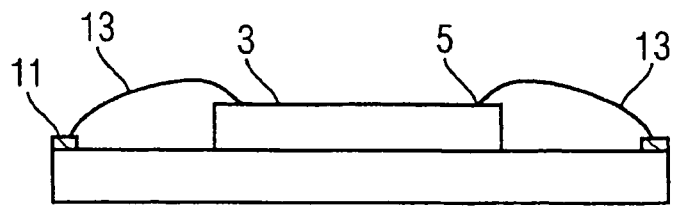
Figure 7E:
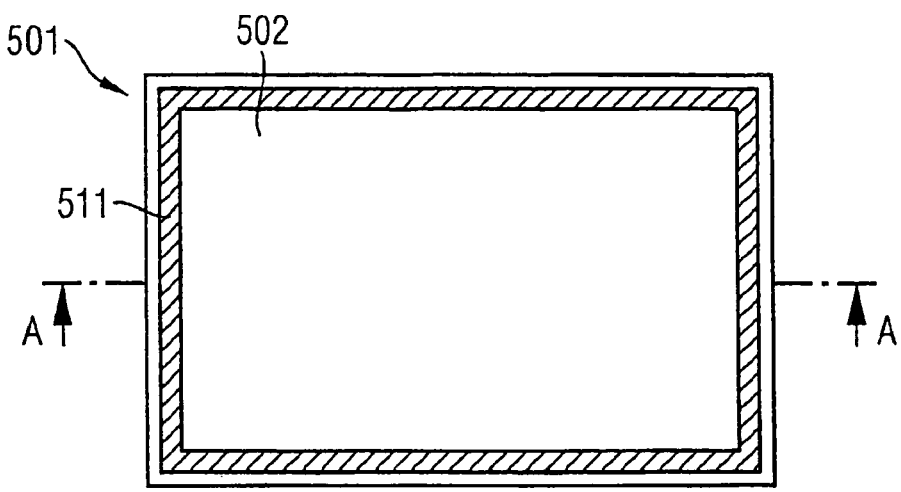
Figure 7F:
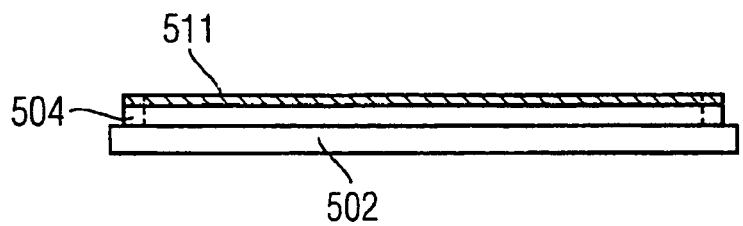

FIGS. 7e and 7f are views of a fifth leadframe 501 according to embodiments of the invention. Elements of the leadframe 501 are given reference numbers that are greater by 400 than the corresponding elements of the leadframe 101 of FIG. 3. In this case, the pedestals 104 of FIG. 3 are replaced by a single pedestal 504 encircling the central portion of the plate 302, which is to receive the die. The top surface of the pedestal 504 is plated with silver 511, and thus forms a ring analogous to the ring 11 of FIG. 2. Compared to the embodiments of the invention discussed previously, the leadframe 501 is more flexible. This is because, during packaging, the wires can be formed from the contacts of the integrated circuit that are to be grounded to any location along the periphery of the central portion of the leadframe 501. This is unlike the previous embodiment, where wire bonds are connected to the pedestals 104, 204, 304, 404, and therefore it is necessary to ensure that the wires extend to the correct locations.

The fabrication process, and use, of the central portion of the leadframe 701 is as explained above with reference to FIGS. 4 and 5, but with different positions of the mask elements.

Figure 7G:
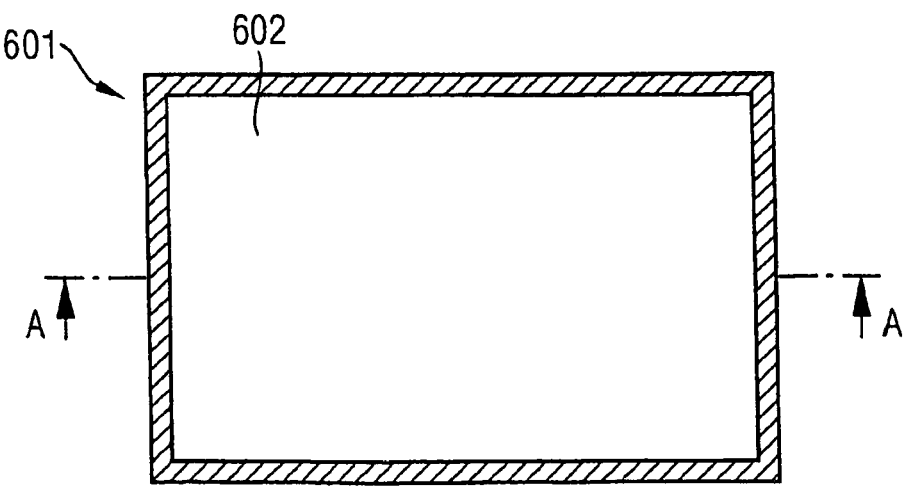
Figure 7H:
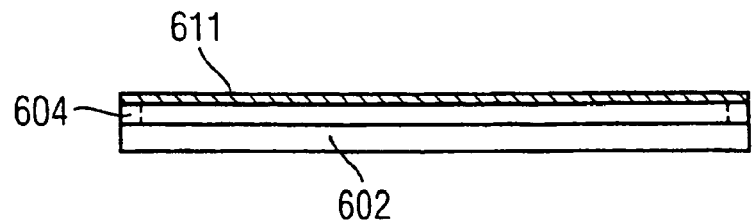

FIGS. 7g and 7h are views of a central portion of a sixth leadframe 601 according to embodiments of the invention. Elements of the leadframe 601 are given reference numbers that are greater by 100 than the corresponding elements of the leadframe 501. In this case, the ring 611 is located at the outer edge of the plate 602.

Figure 8A:
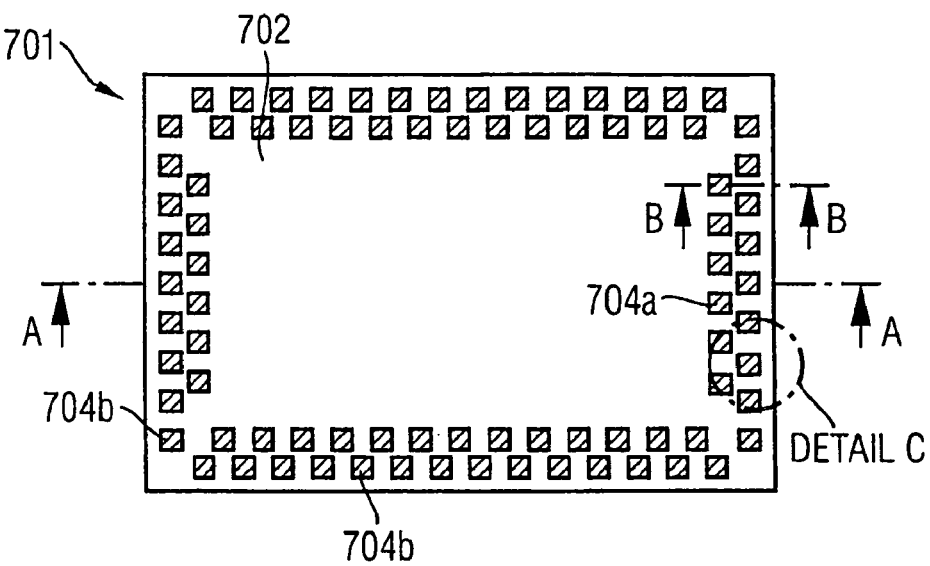
FIGS. 8a to 8d are four views of a leadframe which is another embodiment of the invention.
Figure 8B:
Figure 8C:
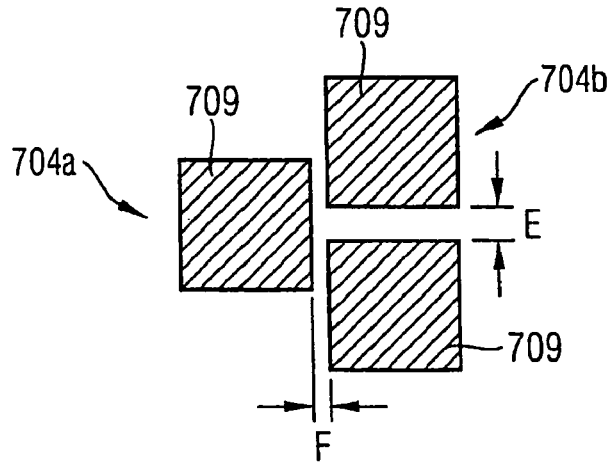
Figure 8D:
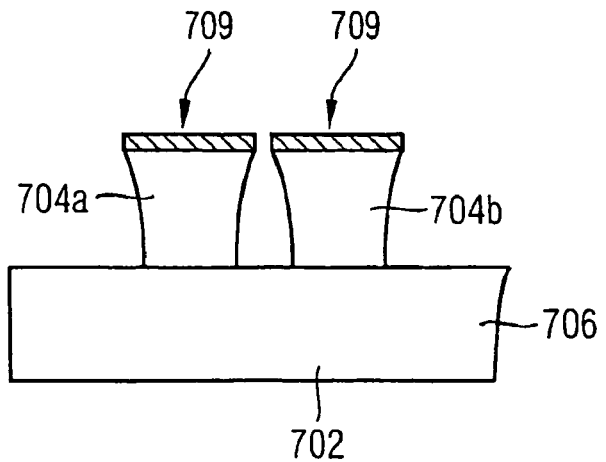

FIGS. 8a to 8d are four views of part of a seventh leadframe 701 according to embodiments of the invention. FIG. 8a is a top view. FIG. 8b is a sectional view in the line A-A on FIG. 8a. FIG. 8c is a sectional view of the portion of the leadframe 701 marked as "detail C" in FIG. 8a, and FIG. 8d is a sectional view in the line B-B in FIG. 8a. The leadframe 701 resembles the leadframe 301 of FIG. 7a, so elements of FIG. 8 corresponding to those of FIG. 7a are labeled by reference numerals that are greater by 400. In contrast to the leadframe 301, the leadframe 701 has pedestals 704a, 704b along each side of the central portion in two groups. A first group of pedestals 704b is displaced inwardly by a first distance from the edge 706 of the central portion, while a second group of pedestals 704a is displaced inwardly from the edge 706 by a greater distance. There is a distance E between pairs of the pedestals 704a, and between pairs of the pedestals 704b, and a distance F between the groups 704a and 704b.

Dimensions E and F may each be in the range 10 to 100 μm.

Figure 9A:
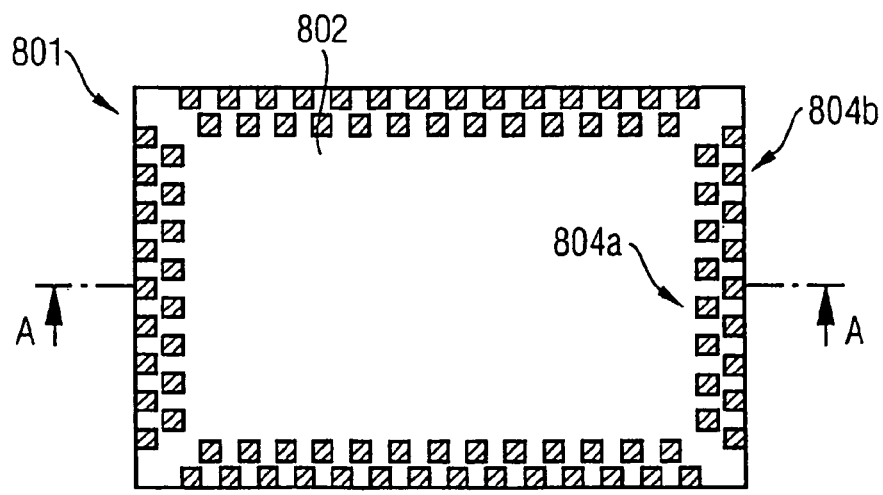
FIG. 9, which is composed of FIGS. 9a to 9j shows five leadframes which are other embodiments of the invention.
Figure 9B:
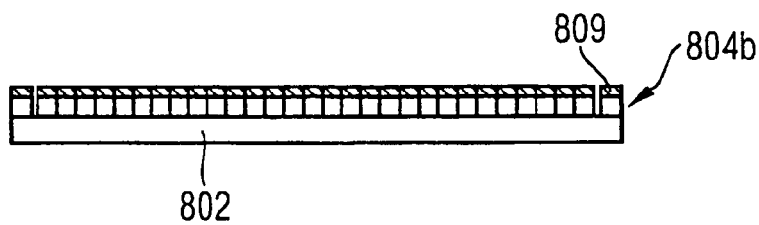

FIGS. 9a and 9b are views of a central portion of an eighth leadframe 801 according to embodiments of the invention. FIG. 9b is a view in the direction shown as A-A in FIG. 9a. The leadframe 801 resembles the leadframe 401, but includes pedestals 804a that are spaced from the edge of the plate 802, and pedestals 804b that extend to the edges of the plate 802. Elements of the leadframe 801 are given reference numbers that are greater by 400 than the corresponding elements of the leadframe 401.

Figure 9C:
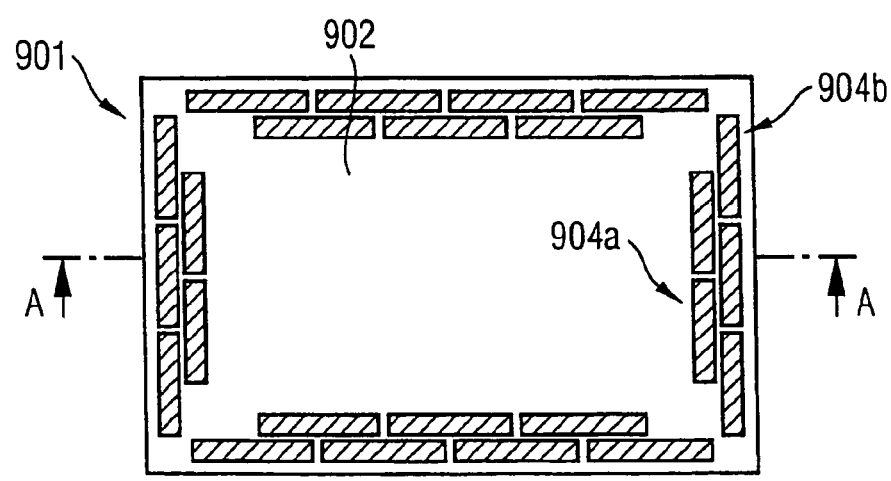
Figure 9D:
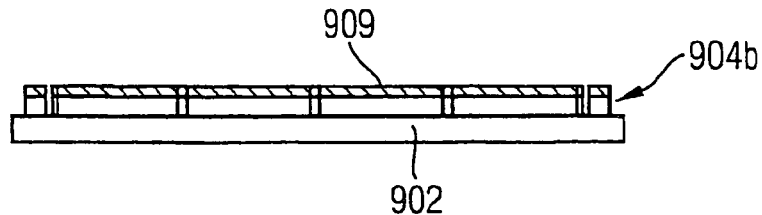

FIGS. 9c and 9d are views of a central portion of a ninth leadframe 901 according to embodiments of the invention. FIG. 9d is a view in the direction shown as A-A in FIG. 9c. The leadframe 901 resembles the leadframe 101, but includes pedestals 904a, 904b at two distances from the sides of the leadframe 901.

Elements of the leadframe 901 are given reference numbers that are greater by 800 than the corresponding elements of the leadframe 101.

Figure 9E:
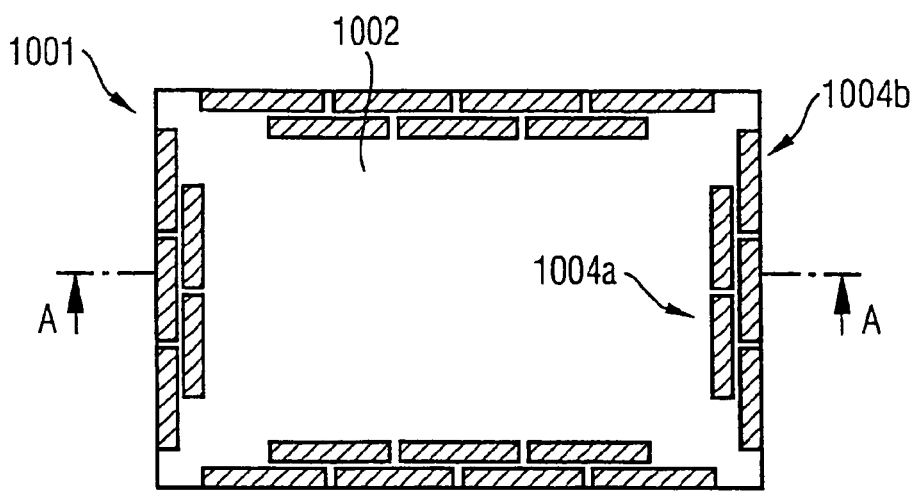
Figure 9F:
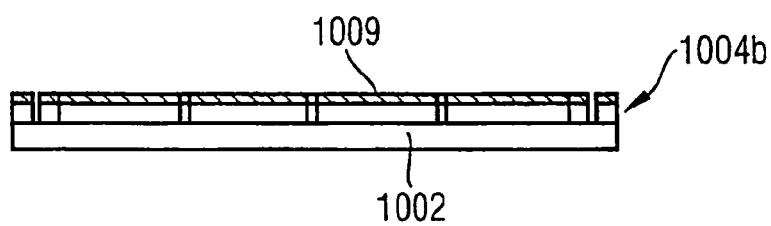

FIGS. 9e and 9f are views of a central portion of a tenth leadframe 1001 according to embodiments of the invention. FIG. 9f is a view in the direction shown as A-A in FIG. 9e. The leadframe 1001 resembles the leadframe 201, but includes pedestals 1004a, 1004b at two distances from the sides of the leadframe 1001. Elements of the leadframe 1001 are given reference numbers that are greater by 800 than the corresponding elements of the leadframe 201.

Figure 9G:
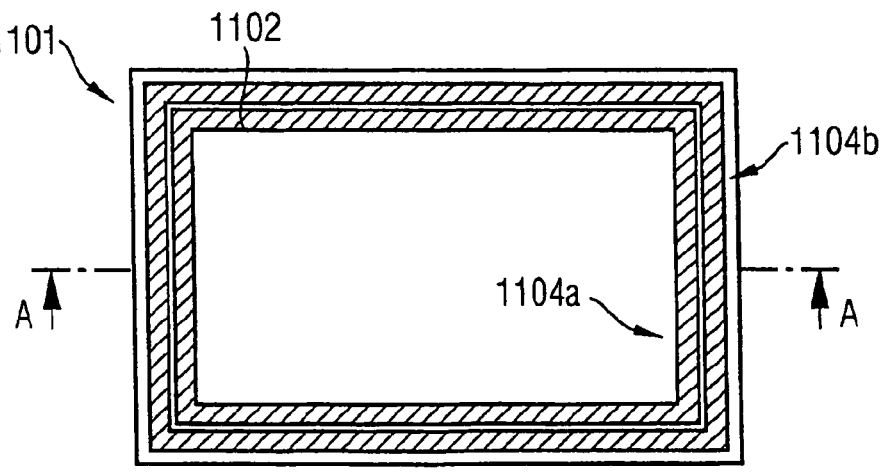
Figure 9H:
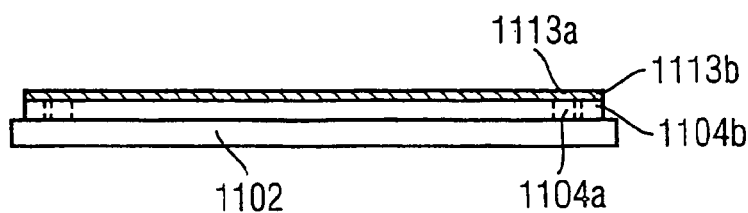

FIGS. 9g and 9h are views of a central portion of an eleventh leadframe 1101 according to embodiments of the invention. FIG. 9h is a view in the direction shown as A-A in FIG. 9g. The leadframe 1101 resembles the leadframe 501, but includes pedestals 1104a, 1104b at two distances from the sides of the leadframe 1101, supporting respective rings 1113a, 1113b. Elements of the leadframe 1101 are given reference numbers that are greater by 600 than the corresponding elements of the leadframe 501.

Figure 9I:
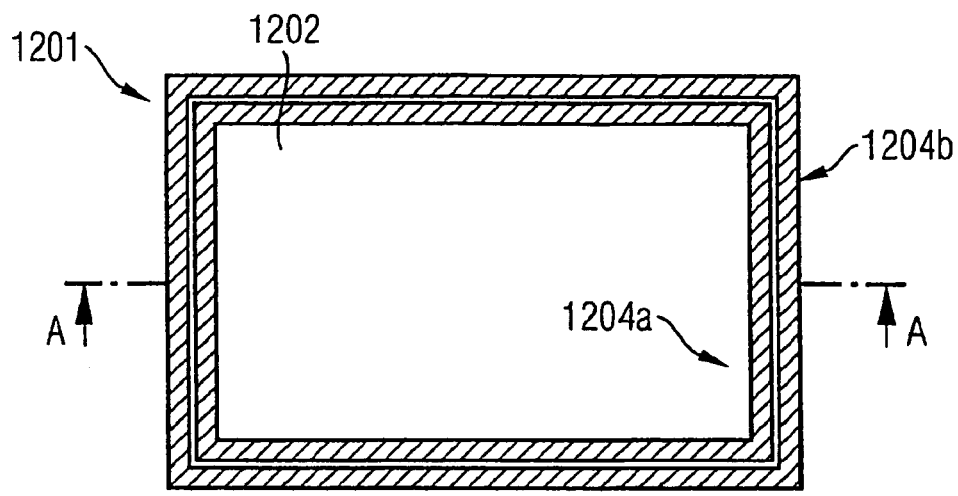
Figure 9J:
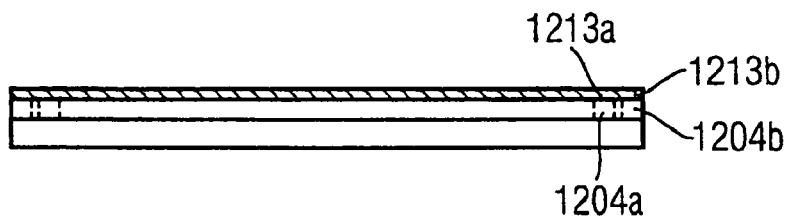

FIGS. 9i and 9j are views of a central portion of a twelfth leadframe 1201 according to the invention. FIG. 9j is a view in the direction shown as A-A in FIG. 9i. The leadframe 1201 resembles the leadframe 601, but includes pedestals 1204a, 1204b at two distances from the sides of the leadframe 1201, supporting respective rings 1213a, 1213b. Elements of the leadframe 1201 are given reference numbers that are greater by 600 than the corresponding elements of the leadframe 601.

Although only twelve embodiments of the invention have been described above in detail, many variations are possible within the scope of the invention as will be clear to a person with ordinary skill in the art.

What is claimed is:

1. An integrated circuit package, comprising:
   a leadframe including a central portion formed of conductive material, the central portion comprising a die pad area for attachment of an integrated circuit, and one or more upright portions;
   an integrated circuit located at the die pad area, wherein the one or more upright portions of the leadframe are electrically connected to contacts of the integrated circuit that are grounded;
   wire bonds between at least one electrical contact of the integrated circuit and a respective contact on the upright portions; and
   a resin body encapsulating the wire bonds.

2. The integrated circuit package according to claim 1, in which upper surfaces of the upright portions of the leadframe are plated with silver.

3. The integrated circuit package according to claim 1, in which each of the upright portions are located at, or proximate to, one of the lateral sides of the central portion of the leadframe.

4. The integrated circuit package according to claim 3, in which the upright portions of the leadframe which are at, or proximate to, at least one of the sides of the leadframe are in one or more groups, the upright portions of each group being at the same respective distance from the sides of the leadframe.

5. The integrated circuit package according to claim 3, in which each of the upright portions at, or proximate to, at least one of the sides of the leadframe, extend continuously along at least half of the length of that side.

6. The integrated circuit package according to claim 5, in which the upright portions extend continuously along substantially the entire periphery of the central portion.

7. A method of forming a component, the method comprising:
  selectively etching one surface of a central conductive portion of a leadframe to form upright portions, each with a top surface, on a die pad area of the leadframe; and
  providing a layer of a conductive material on the top surface of the upright portions.

8. The method of claim 7, further comprising:
  placing an integrated circuit on the die pad area of the leadframe;
  forming wires between one or more electrical contacts of the integrated circuit and the upright portions of the leadframe; and
  encapsulating the integrated circuit, wires and the upright portions of the leadframe.

9. The method of claim 8, wherein encapsulating the integrated circuit, wires and the upright portions of the leadframe comprises encapsulating the integrated circuit, wires and the upright portions of the leadframe in a resin body.

10. The method of claim 8, wherein providing a layer of a conductive material comprises plating upper surfaces of the upright portions of the leadframe are plated with silver.

11. The method of claim 7, wherein encapsulating the integrated circuit, wires and the upright portions of the leadframe comprises encapsulating the integrated circuit, wires and the upright portions of the leadframe in a resin body.

12. The method of claim 7, wherein providing a layer of a conductive material comprises plating upper surfaces of the upright portions of the leadframe are plated with silver.

13. A leadframe for packaging an integrated circuit, the leadframe comprising:
  a central portion formed of conductive material, the central portion of the leadframe including a die pad area for attachment of an integrated circuit;
  one or more upright pedestals formed on the die pad area; and
  contacts on the leadframe.

14. The leadframe according to claim 13, wherein the contacts of the leadframe are grounded.

15. The leadframe according to claim 13, in which the pedestals comprise a top surface, the top surface being plated with a conductive material.

16. The leadframe according to claim 13, in which the pedestals are located at, or proximate to, edges of the central portion.

17. The leadframe according to claim 16, in which the pedestals are in one or more groups, the pedestals of each group being at the same respective distance from the edges of the central portion, while each group is located at a different distance from the edges of the central portion.

18. The leadframe according to claim 16, in which each of the pedestals extend continuously along at least half of the length of the edge of the central portion.

19. The leadframe according to claim 16, in which the pedestals extend continuously along substantially the entire periphery of the central portion.

* * * * *

UNITED STATES PATENT AND TRADEMARK OFFICE
CERTIFICATE OF CORRECTION

PATENT NO. : 7,411,280 B2  Page 1 of 1
APPLICATION NO. : 11/364457
DATED : August 12, 2008
INVENTOR(S) : Yazid et al.

It is certified that error appears in the above-identified patent and that said Letters Patent is hereby corrected as shown below:

In Col. 7, line 28, after leadframe delete "are plated".
In Col. 8, line 3, after leadframe delete "are plated".

Signed and Sealed this

Eleventh Day of November, 2008

JON W. DUDAS
*Director of the United States Patent and Trademark Office*